United States Patent
Bertrán Serra et al.

(10) Patent No.: US 10,807,907 B2
(45) Date of Patent: Oct. 20, 2020

(54) SURFACE HAVING PROPERTIES THAT REDUCE LIGHT SCATTERING BY WATER CONDENSATION AND METHOD FOR THE PRODUCTION THEREOF

(71) Applicants: UNIVERSITAT DE BARCELONA, Barcelona (ES); ADVANCED NANOTECHNOLOGIES, S. L., Barcelona (ES)

(72) Inventors: Enric Bertrán Serra, Barcelona (ES); Roger Amade Rovira, Barcelona (ES)

(73) Assignees: UNIVERSITAT DE BARCELONA, Barcelona (ES); ADVANCED NANOTECHONOLOGIES, S. L., Barcelona (ES)

( * ) Notice: Subject to any disclaimer, the term of this patent is extended or adjusted under 35 U.S.C. 154(b) by 810 days.

(21) Appl. No.: 15/120,047

(22) PCT Filed: Feb. 20, 2015

(86) PCT No.: PCT/ES2015/070116
§ 371 (c)(1),
(2) Date: Jan. 19, 2017

(87) PCT Pub. No.: WO2015/124823
PCT Pub. Date: Aug. 27, 2015

(65) Prior Publication Data
US 2017/0166475 A1 Jun. 15, 2017

(30) Foreign Application Priority Data
Feb. 20, 2014 (ES) .................................. 201430230

(51) Int. Cl.
*B32B 3/10* (2006.01)
*C03C 17/09* (2006.01)
(Continued)

(52) U.S. Cl.
CPC ............ *C03C 17/09* (2013.01); *C03C 17/008* (2013.01); *C03C 17/245* (2013.01);
(Continued)

(58) Field of Classification Search
None
See application file for complete search history.

(56) References Cited

U.S. PATENT DOCUMENTS

| | | | | |
|---|---|---|---|---|
| 5,494,743 A * | 2/1996 | Woodard | ................ | C03C 17/42 204/192.14 |
| 2002/0122962 A1* | 9/2002 | Arfsten | ................ | C03C 17/007 428/697 |
| 2013/0171413 A1 | 7/2013 | Khan et al. | | |

FOREIGN PATENT DOCUMENTS

| | | |
|---|---|---|
| WO | WO 2009/140482 | 11/2009 |
| WO | WO 2010/063440 | 6/2010 |
| WO | WO 2010/129807 | 11/2010 |

OTHER PUBLICATIONS

PCT International Search Report and Written Opinion of the International Search Authority, Spain, International Application No. PCT/ES2015/070116, dated Jul. 5, 2015, 9 pages.

* cited by examiner

*Primary Examiner* — Christopher M Polley

(57) ABSTRACT

Surface having properties for reducing diffuse light due to water condensation, wherein the antifog means consist in atomic aggregates adhered to and dispersed over the surface, wherein the aggregates are selected among the transition metals and the silicon. It is also related to a method for obtaining a surface having properties for reducing diffuse light due to water condensation a wavelength selected in the range from 100 nm to 50 micrometers, comprising the steps of selecting the wavelength, obtaining a glass or polymer surface that has been subjected to optical polishing and (Continued)

adhering to the surface atomic aggregates which are selected among the transition metals and the silicon with a separation between them being lower than or having an order of the selected wavelength selected. Thus a durable antifogging surface is obtained.

6 Claims, 2 Drawing Sheets

(51) Int. Cl.
| | |
|---|---|
| C03C 17/245 | (2006.01) |
| C03C 23/00 | (2006.01) |
| C03C 17/00 | (2006.01) |
| C23C 14/02 | (2006.01) |
| C23C 14/18 | (2006.01) |
| C23C 14/34 | (2006.01) |
| C23C 14/35 | (2006.01) |
| C23C 16/02 | (2006.01) |
| C23C 16/18 | (2006.01) |
| C23C 18/04 | (2006.01) |
| C23C 18/08 | (2006.01) |

(52) U.S. Cl.
CPC ........ *C03C 23/0075* (2013.01); *C23C 14/028* (2013.01); *C23C 14/185* (2013.01); *C23C 14/3414* (2013.01); *C23C 14/35* (2013.01); *C23C 16/0254* (2013.01); *C23C 16/18* (2013.01); *C23C 18/04* (2013.01); *C23C 18/08* (2013.01); *C03C 2217/213* (2013.01); *C03C 2217/258* (2013.01); *C03C 2217/26* (2013.01); *C03C 2217/27* (2013.01); *C03C 2217/29* (2013.01); *C03C 2217/42* (2013.01); *C03C 2217/75* (2013.01); *C03C 2218/112* (2013.01); *C03C 2218/151* (2013.01); *C03C 2218/152* (2013.01); *C03C 2218/156* (2013.01); *C03C 2218/345* (2013.01)

SURFACE HAVING PROPERTIES THAT REDUCE LIGHT SCATTERING BY WATER CONDENSATION AND METHOD FOR THE PRODUCTION THEREOF

TECHNICAL FIELD

The present invention relates to a surface having properties for reducing diffuse light due to water condensation which ensures high durability and high anti-fogging efficiency.

BACKGROUND OF THE INVENTION

Surfaces provided with antifogging means are known, i.e. surfaces provided by diffusion reduction properties due to water condensation. Specifically, surfaces treated with oxides combined with organic compounds and that are transparent are known, which aim to turn surfaces into superhydrophilic surfaces. These oxides are generally applied as a coating, coating, meaning the formation of a thin layer provided with these oxides on the surface to which it is desired to provide with anti-fogging capacities.

However, this type of coating, for example, as that described in US 2007166513, has a limited life since it is organic based and also its preparation process is very complex, which makes them impractical for industrial mass applications.

DESCRIPTION OF THE INVENTION

For overcoming the prior art drawbacks, the present invention proposes a surface having properties for reducing diffuse light ("scattering") due to water condensation, comprising atomic aggregates adhered to and dispersed over the surface, wherein the aggregates are selected among silicon and the transition metals, which meet with the condition:

$$\gamma_c > 4\gamma_s$$

where:

$\gamma_c$ is the surface energy of the transition metal;
$\gamma_s$ is the surface energy of the surface;

By atomic aggregate it is meant a set of grouped atoms forming a compact core having nanoscale or submicron dimensions.

Therefore, according to the present invention, instead of adding to the surface a coating, as it is done in the prior art, the mentioned aggregates (nanoparticles, nuclei, clusters, nanometric formations) attached or embedded and isolated without forming a coating, but remaining as nuclei scattered across the surface.

The effect of these aggregates or nuclei is to cause the surface to be superhydrophilic for the droplets having a diameter greater than the distance between nuclei or aggregates. This prevents the formation of droplets G having a convex surface with a size above a certain size, size to be selected depending on the wavelength above which it is desired to prevent diffusion or scattering of light. That is, the drops of convex surface above a certain size will not be allowed to "survive", but instead will adhere to the surface by making the contact angle (the supplemental to α in FIG. 5) close to 0°.

In the vast majority of anti-fog coatings, compounds that are transparent are used, so that their use as anti-fogging means do not involve a reduction in transmittance, which obviously it is desired not affect.

However, the inventors have noted that despite the high optical absorption of the selected elements, their application according to the invention reduces very slightly the overall transmittance of the surface, since it is only necessary to attach or embed the isolated structures (nanoparticles, clusters or aggregates) necessary to prevent the formation of droplets above a certain size, that is, there is no need to perform a continuous coating (FIG. 1), and most of the surface will remain transparent. FIG. 2 shows a micrograph made by scanning electron microscopy (SEM), corresponding to a sample of Ti and W nanoparticles deposited on a polished crystalline silicon substrate at electronic level and with the layer of native silicon oxide (($SiO_2$/c-Si). This type of substrate favors the observation of nanoparticles.

In particular, the transition metals and the silicon have a high surface energy, greater than about 2 J/m, which makes them specially adapted for the hydrophilic function.

Chemically, a high surface energy is sometimes associated with a large number of possible oxidation states of the atoms forming the isolated structures, especially two or more, which is the case for some of the mentioned elements.

The aggregates may be selected from W, Os, Re, Ti, Cr and Ru, or a combination thereof, such as a combination of W and Ti. The inventors have noted that these elements, and said combination provide surfaces with excellent anti-fog properties.

The aggregates can also be selected from Mo and V. Although with these elements less noticeable anti-fog performances are achieved.

Pd, Zr and metal carbides and nitrides such as WC and ZrN can also be used, albeit with less marked anti-fogging effect.

Advantageously, the aggregates are spaced apart a maximum distance of the micrometer order.

More advantageously, the surface is a free surface of a transparent surface, and preferably the substrate is made of glass or polymer and has previously been subjected to optical polishing in order to perform the required optical function for transmission or reflection of sharp images and prevent scattering or diffusion of light.

More advantageously, the surface is a free surface of a metal substrate subjected to optical polishing in order to perform the required optical function for reflecting sharp images and prevent scattering or diffusion of light.

More advantageously, the surface is a surface formed by a dielectric structure of one or more layers deposited on a substrate subjected to optical polishing in order to perform the optical function required for the transmission or reflection of sharp images and avoid dispersion or light scattering.

Finally, the aggregates cover at the most 5% of the surface, above which percentage the reduction in transmittance due to the aggregates may become too high. This is clearly the case when looking for a high transparency of the device. Now if this is not the case, such as mirrors, in sunglasses or glasses with light filters, which can have very low transmittances, applying the invention will also be advantageous when it is desired not to lose the image sharpness.

The invention is also related to a method for obtaining a surface having properties for reducing diffuse light due to water condensation a wavelength selected in the range from 100 nm to 50 micrometers, comprising the steps of:

a) Selecting a wavelength between 100 nm and 50 micrometers for which a diffusion reduction due to water condensation by said surface is sought;

b) Obtaining a glass or polymer surface that has been subjected to optical polishing;

c) Adhering to the surface atomic aggregates which are selected among the transition metals and the silicon with a separation between them being lower than or having an order of the selected wavelength.

Preferably, the aggregates are selected among W, Ti, Cr, Os, Re and Ru, and combinations thereof. They can also be selected from Mo and V, although in this case the results are less noticeable.

According to a first variant, step c) is a physical vapor deposition treatment by sputtering over an optical surface, wherein the target is made of the mentioned elements and their alloys and wherein the discharge time is selected for obtaining a surface comprising punctually adhered and distributed aggregates formed during the nucleation process.

According to a second variant, step c) is a physical vapor deposition treatment by evaporation over an optical surface, a metal composed of any of the above elements that may evaporate and their alloys and wherein the deposition time is selected for obtaining a surface comprising punctually adhered and distributed aggregates formed during the nucleation process.

According to a third variant, step c) is a chemical vapor deposition treatment over an optical surface, from an organometallic compound based on any of the above atoms and combinations thereof and wherein the deposition time is selected for obtaining a surface comprising punctually adhered and distributed aggregates formed during the nucleation process.

According to a fourth variant, step c) is a surface treatment by spray deposition and pyrolysis over an optical surface, of an organometallic compound based on any of the mentioned atoms and their combinations and wherein the deposition time is selected for obtaining a surface comprising punctually adhered and distributed aggregates formed during the nucleation process.

According to a fifth variant, step c) is a physical vapor deposition treatment over an optical surface by sputtering from a target by ion gun, wherein the target is made of the mentioned elements and their alloys and wherein the discharge time is selected for obtaining a surface comprising punctually adhered and distributed aggregates formed during the nucleation process.

According to a sixth variant, step c) is a physical vapor deposition treatment over an optical surface by sputtering from a target by plasma gun, wherein the target is made of the mentioned elements and their alloys and wherein the discharge time is selected for obtaining a surface comprising punctually adhered and distributed aggregates formed during the nucleation process.

BRIEF DESCRIPTION OF THE DRAWINGS

For a better understanding of what has been outlined some drawings are attached in which, schematically and solely by way of non-limiting example, the principles underlying the invention are illustrated.

DESCRIPTION OF PREFERRED EMBODIMENTS OF THE INVENTION

Figure 1:
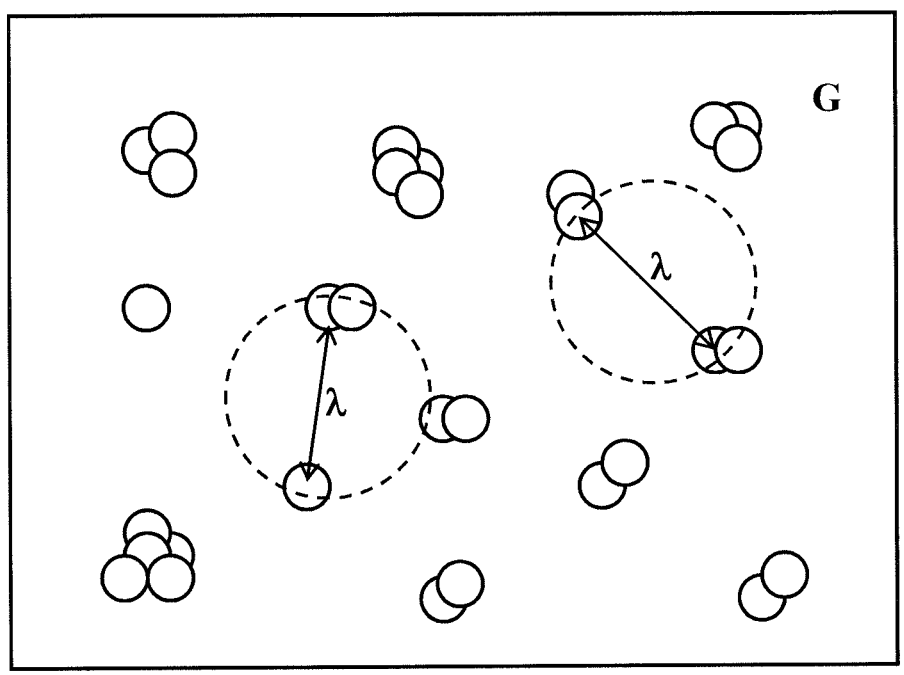
FIG. 1 is a schematic plan view of a distribution of aggregates or nuclei on a surface.
Figure 2:
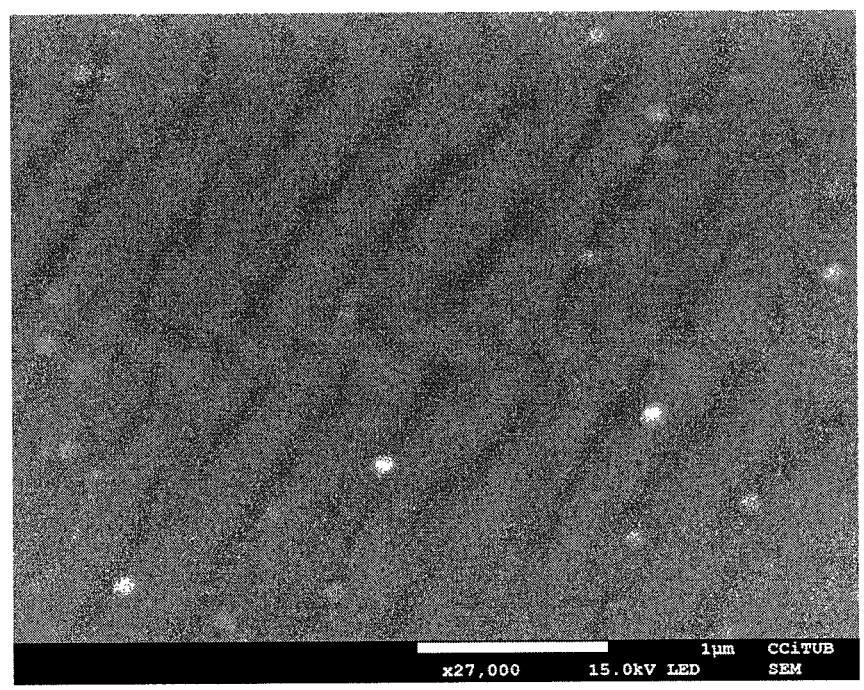
FIG. 2 corresponds to a micrograph with scanning electron microscope (SEM) of a sample of Ti and W nanoparticles deposited on a crystalline silicon substrate with the native oxide layer ($SiO_2$/c-Si).
Figure 3:
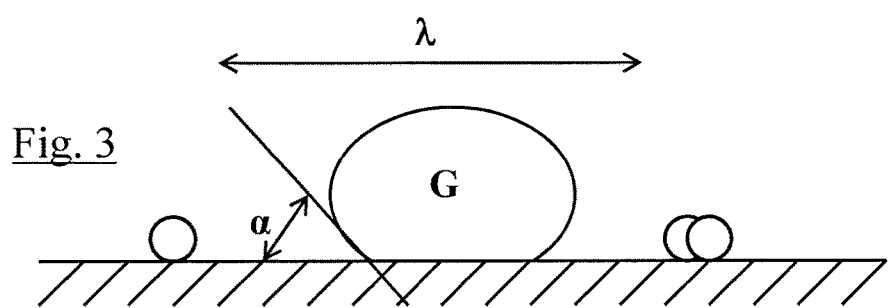
FIG. 3 is a schematic section showing that a drop of water with a lesser diameter than the spacing between aggregates is not affected, but since being lesser than the wavelength, it does not affect optically significantly (the percentage of generated diffused light is low).

As it can be seen in FIG. 1, the invention relates to a surface having properties for reducing diffuse light due to water condensation, characterised in that it comprises atomic aggregates adhered to and scattered over the surface, wherein the aggregates are selected among silicon and the transition metals, which preferably, meet the condition:

$$\gamma_c > 4\gamma_s$$

where:

$\gamma_c$ is the surface energy of the transition metal;
$\gamma_s$ is the surface energy of the surface;

Since they are hydrophilic elements, when depositing a drop of water G having a lesser size than the spacing between aggregates, nothing happens, as illustrated in FIG. 3. But since it is a drop which diameter is lesser than the wavelength for which the diffusion is to be avoided, it does not cause appreciable diffusion of light.

Figure 4:
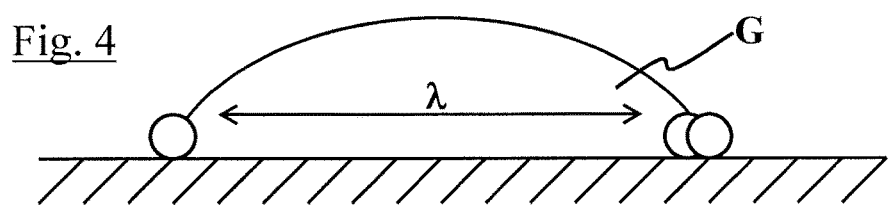
FIGS. 4 and 5 are schematic sections showing what happens to a drop of water having a diameter having the order of the separation between aggregates. The contact angle and the convexity of the drop are reduced to very low values, and thus the diffuse light is reduced by the drop and the transmitted image significantly gains in clarity.
Figure 5:
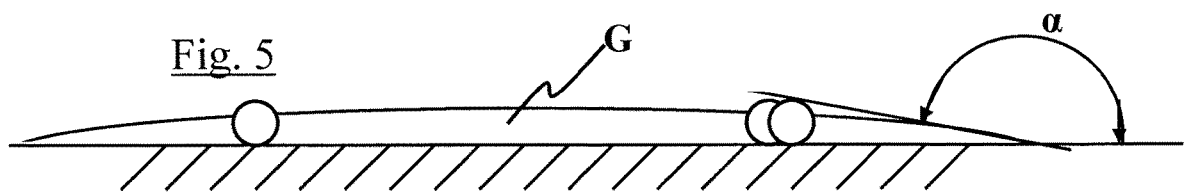

Instead, as shown in FIG. 4, if a drop is deposited whose diameter is about the average separation between aggregates, then an appreciable diffusion would occur for a wavelength λ corresponding to said average separation. However, as the separation of nuclei is selected to be of the order of the wavelength, these nuclei "capture" the droplet G, preventing it to survive as such, so that it adheres to the surface as illustrated in FIG. 5, where it is observed that the contact angle "theta"θ is close to 0°, so that the drop forms a film that does not cause or hardly causes diffusion.

Below is a table in which the contact angles measured without and with aggregates are presented, particularly for W, Ti is present, and combinations of these in different orders:

| Substrate | Atomic aggregates Composition | Contact angle (°) | Transmittance |
|---|---|---|---|
| Glass 1 | — | 107 ± 1 | 92% |
| Glass 1 | W | 12 ± 1 | 90% |
| Glass 2 | — | 96 ± 1 | 92% |
| Glass 2 | Ti | 50 ± 1 | 90% |
| Glass 3 | — | 78 ± 1 | 92% |
| Glass 3 | Ti/W | 54 ± 1 | 90% |
| Glass 4 | — | 76 ± 1 | 92% |
| Glass 4 | W/Ti | 3 ± 1 | 90% |
| Glass 5 | — | 76 ± 1 | 92% |
| Glass 5 | $SiO_2$/W/Cr | 2 ± 1 | 90% |

It is pointed out that the glasses used were different, thus the difference in the contact angle prior to subject them to the anti-fog treatment. Clean glass, silanized glass, Teflon or polystyrene can be used. $SiO_2$-cristobalite, $SiO_2$-quartz, or pure glass $SiO_2$ could also be used.

The invention is also related to a method for obtaining this surface, specifically a surface with properties for diffusion reduction at a wavelength λ selected in the range between 100 nm to 50 micrometers, comprising the steps of:

a) Selecting a wavelength λ between 100 nm and 50 micrometers for which a diffusion reduction by said surface due to condensation is sought;

b) Obtaining a glass or polymer surface that has been subjected to optical polishing;

c) Adhering to the surface atomic aggregates which are selected among the transition metals which meet:

$$\gamma_c > 4\gamma_s$$

particularly W, Ti, Ru, Cr, Mo or V or silicon, with a separation between them being lower than or having an order of the selected wavelength $\lambda$;

According to a preferred embodiment of the method, step c) is a physical vapor deposition treatment by sputtering over an optical surface, wherein the target is made of the mentioned elements and their alloys and wherein the discharge time is selected for obtaining a surface comprising punctually adhered and distributed aggregates formed during the nucleation process.

Description of the Process for Obtaining a Glass Surface with W Atomic Aggregates The W was deposited by sputtering with a magnetron excited with RF power (13.56 MHz).

Previously, the glass substrate was degreased with an oxidizing solution PIRANHA, and the glass had an optical polishing with 92% of transmittance.

The arrangement of the deposits was as follows:

W (0.28 nm)/glass.

Where the thickness represents the thickness that would be obtained if the deposit was made in layers.

The pre-vacuum of the reactor reached $3.1 \times 10^{-4}$ Pa prior to the deposition of W.

To carry out the deposition 20 sccm of argon with 99.999% purity were introduced. The reactor pressure during the deposition was kept constant at 1.03 Pa, with a feedback system provided with a capacitive pressure sensor and a motorized valve.

The cathode (target) to sample distance was 8 cm. The target was 3" in diameter and the cathode was cooled with water.

The power supplied to the cathode was 30 W direct and 0 W reflected. The self-polarization voltage was −82 V.

The deposition time was 6.4 s.

The obtained samples had a rather high anti-fogging efficiency. It was verified that after two years, the effect lingered.

Description of the Process for Obtaining a Glass Surface with W and Ti Atomic Aggregates W and Ti were deposited by sputtering with a magnetron excited with RF power (13.56 MHz).

Previously, the glass substrate was degreased with an oxidizing solution PIRANHA, and the glass had an optical polishing with 92% of transmittance.

The arrangement of the deposits was as follows:

W(0.28 nm)/Ti(0.28nm)/glass.

Where the thickness represents the thickness that would be obtained if the deposit was made in layers.

The pre-vacuum of the reactor reached $5.3 \times 10^{-4}$ Pa prior to the deposition of Ti, and $1.3 \times 10^{-3}$ Pa prior to the deposition of W.

To carry out the deposition, 20 sccm of argon with 99.999% purity were introduced. The reactor pressure during the deposition was kept constant at 1.03 Pa, with a feedback system provided with a capacitive pressure sensor and a motorized valve.

The cathode (target) to sample distance was 8 cm. The target was 3" in diameter and the cathode was cooled with water.

The power supplied to the cathode was 100W forward and 9 W reflected for the Ti and 30 W forward and 0 W reflected for the W. The self-polarization voltage was −90 V for the Ti, and −85.5 V for the W.

The deposition time was 2.43 s for the Ti, and 6.4 s for the W.

The obtained samples had a very high anti-fogging efficiency, even greater than in the W/glass previously described case. It was also checked that after two years, this efficiency was maintained, even after wiping the surfaces with alcohol.

The effect of the combination of W/Ti yields much more remarkable results than when using only one of the two metals.

Description of the Process for Obtaining a Glass Surface with W and Cr Atomic Aggregates Coated with an Ultrathin Layer of $SiO_2$ W and Cr were deposited by sputtering with a magnetron excited with RF power (13.56 MHz).

Previously, the glass substrate was degreased with an oxidizing solution PIRANHA, and the glass had an optical polishing with 92% of transmittance.

The arrangement of the deposits was as follows:

$SiO_2$(10 nm)/W(0.28 nm)/Cr(0.28 nm)/glass.

Where the thickness represents the thickness that would be obtained if the deposit was made in layers.

The pre-vacuum of the reactor reached $4.0 \times 10^{-4}$ Pa prior to the deposition of Cr, $3.0 \times 10^{-3}$ Pa prior to the deposition of W, and $3.2 \times 10^{-3}$ Pa prior to the deposition of $SiO_2$.

To carry out the deposition, 20 sccm of argon with 99.999% purity were introduced. The reactor pressure during the deposition was kept constant at 1.03 Pa, with a feedback system provided with a capacitive pressure sensor and a motorized valve. For the $SiO_2$ deposition a mixture of Ar and $O_2$ gases was used to produce stoichiometric silicon oxide.

The cathode (target) to sample distance was 8 cm. The target was 3" in diameter and the cathode was cooled with water.

The power supplied to the cathode was 100 W forward and 0 W reflected for the Cr and de 30 W forward and 0 W reflected for the W. The self-polarization voltage was −145 V for the Cr, and −85.5 V for the W.

The deposition time was 5 s for the Cr, 6.4 s for the W and 60 s for the $SiO_2$.

The obtained samples shown the highest anti-fogging efficiency among all the produced samples. The effect of the $SiO_2$/W/Cr combination is the highest of the studied cases.

Once the surface structuration treatment carried out, the contact angle measured immediately after the treatment is generally less than 5°, i.e. is a superhydrofillic state.

However, it has been observed that the treated surface loses the anti-fogging effect with time due to air pollution, dirt, dust, etc. This deactivation is related to an effect of:

a) corrosion or rusting of nanostructures, b) a decrease of free links or c) by formation of contaminant deposits hiding the nanostructure.

In all three cases an increase of contact angle to values between 20° and 30° where it usually stabilizes manifests. The superhidrofillic state is an energetically activated and unstable state, and tends naturally to an energetically deactivated state with exposure to moisture, oxygen, environmental pollution, dirt, etc. It is possible to reactivate the anti-fogging effect, with recovery of low contact angles, by various methods. Replacement of the energetically activated state can be accomplished in several ways:

a) Chemical reduction with a nonoxidizing acid solution (e.g. HCl, HF, acetic acid, citric, etc.) or etching with orthophosphoric acid.

b) Mechanical cleaning of the surface by rubbing.

c) Reconstruction of dangling bonds with sputtering, plasma exposure or exposure to ionizing radiation (UV, RX, etc)

d) Adding an activated substance as surfactants or hydrophilic substances.

Furthermore, there are various methods to quickly reactivate the nanostructured surface:

1. Impregnating the surface with a thin layer of vegetable or animal oil;

2. Impregnating the surface with a thin layer of glycerine

3. Using surfactants like Lutensol or laureate impregnated on the surface;

4. Or simply rubbing with a finger. This method has a double effect; on one hand it mechanically cleans the surface and on the other hand, the surface is impregnated with a lipid layer, salts and various organic compounds owing to perspiration.

The method for impregnating can be performed with a cellulosic paper, towel or sponge. It can also be cleaned with soap and water prior to its reactivation to enhance the effect.

The treated surface has an anti-fogging effect that lasts over time depending on environmental pollution or dirt. However, the surface nanostructure is permanent for at least three years and can be reactivated repeatedly during this period. The limit of this effect is marked by the adherence and wear of the surface nanostructures.

It was observed in all cases the reactivation of the anti-fogging effect on nanostructured surfaces.

Other Surface Nanostructuring Methods Based on Langmuir-Blodgett Technique.

A study of the anti-fogging effect due to surface structuring by transferring a compact monolayer of nanoparticles (200-400 nm diameter) on a solid substrate was performed. This transfer procedure is performed by the widely known Langmuir-Blodgett technique [1]. Subsequently, a sputtering of the surface allowing texturing the substrate was performed. This engraving process conferred to the surface a morphology suitable for the anti-fogging effect.

The effect is degraded with time due to the three mechanisms mentioned above, except the oxidation, as $SiO_2$ particles are already in the more stable oxidation state. Also, it can return to the initial state, energetically activated, by the same processes described above. This allows to repeatedly regenerate the anti-fogging effect and decrease the surface contact angle.

Although reference has been made to three particular embodiments of the invention, it is apparent to one skilled in the art that the surface and methods described are susceptible of numerous variations and modifications, and that all the details mentioned can be replaced by other technically equivalent, without departing from the scope of protection defined by the appended claims.

REFERENCES

[1] E. J. Cabrera, L. M. Jailer, R. Amade, S. M. Portal, E. Pascual, E. Bertran, Photonic Characteristics of Langmuir-Blodgett Self-Assembled Monolayers of Colloidal Silica Particles, Nanoscience and Nanotechnology Letters, 2013, 5, 41-45.

The invention claimed is:

1. A substrate having a surface having properties for reducing diffuse light due to water condensation, comprising:

atomic aggregates adhered to and dispersed over the substrate surface, the aggregates selected from among silicon and transition metals, which meet with the condition:

$$\gamma_c > 4\gamma_s$$

where:

$\gamma_c$ is the surface energy of the transition metal, and $\gamma_s$ is the surface energy of the surface; and the aggregates are spaced apart a maximum distance of a micrometer order and cover at most 5% of the substrate surface.

2. The substrate according to claim 1 wherein the aggregates are selected among W, Ti, Cr, Os, Re and Ru or a combinations thereof.

3. The substrate according to claim 1 wherein the aggregates are selected among Mo and V.

4. The substrate according to claim 1 wherein the surface is transparent.

5. The substrate according to claim 1, wherein the substrate is made of glass or polymer.

6. The substrate according to claim 1, wherein the surface has been subjected to optical polishing.

* * * * *